United States Patent
Mayder et al.

(10) Patent No.: US 7,859,277 B2
(45) Date of Patent: Dec. 28, 2010

(54) APPARATUS, SYSTEMS AND METHODS FOR PROCESSING SIGNALS BETWEEN A TESTER AND A PLURALITY OF DEVICES UNDER TEST AT HIGH TEMPERATURES AND WITH SINGLE TOUCHDOWN OF A PROBE ARRAY

(75) Inventors: Romi Mayder, San Jose, CA (US); Pam Stellmacher, Cupertino, CA (US); Edmundo Dela Puente, Cupertino, CA (US); John Andberg, Santa Cruz, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/410,699

(22) Filed: Apr. 24, 2006

(65) Prior Publication Data

US 2007/0247140 A1    Oct. 25, 2007

(51) Int. Cl.
*G01R 31/02*    (2006.01)
(52) U.S. Cl. .................................. 324/754; 324/754.03
(58) Field of Classification Search ......... 324/754–765, 324/158.1
See application file for complete search history.

(56) References Cited

U.S. PATENT DOCUMENTS

| | | | | |
|---|---|---|---|---|
| 5,736,850 A * | 4/1998 | Legal | ...................... | 324/158.1 |
| 5,834,975 A * | 11/1998 | Bartlett et al. | ............... | 330/278 |
| 6,098,142 A * | 8/2000 | Leggett et al. | ............... | 710/220 |
| 6,303,885 B1 * | 10/2001 | Hichwa et al. | ............... | 200/181 |
| 6,490,536 B1 * | 12/2002 | Ellingboe et al. | ........... | 702/115 |
| 6,640,323 B2 * | 10/2003 | Akram | ........................ | 714/724 |
| 6,657,455 B2 * | 12/2003 | Eldridge et al. | .............. | 324/765 |
| 6,678,850 B2 * | 1/2004 | Roy et al. | ..................... | 714/730 |
| 6,681,869 B2 * | 1/2004 | Wursch et al. | .................. | 173/2 |
| 6,703,820 B2 * | 3/2004 | Sunter | ..................... | 324/76.15 |
| 6,762,612 B2 * | 7/2004 | Yu et al. | ...................... | 324/757 |
| 6,773,962 B2 * | 8/2004 | Saia et al. | .................... | 438/118 |
| 6,801,869 B2 * | 10/2004 | McCord | ...................... | 702/117 |
| 7,068,220 B2 * | 6/2006 | DeNatale et al. | ............ | 342/375 |
| 7,091,765 B2 * | 8/2006 | Bilak et al. | .................. | 327/199 |
| 7,245,134 B2 * | 7/2007 | Granicher et al. | ........... | 324/754 |
| 7,504,841 B2 * | 3/2009 | Frame et al. | ................. | 324/754 |
| 2003/0057984 A1 * | 3/2003 | Akram | ........................ | 324/755 |
| 2008/0091961 A1 * | 4/2008 | Cranford et al. | ............ | 713/300 |
| 2009/0128171 A1 * | 5/2009 | Okumura et al. | ............ | 324/754 |
| 2010/0013503 A1 * | 1/2010 | Huebner | ..................... | 324/754 |

* cited by examiner

*Primary Examiner*—Ha Tran T Nguyen
*Assistant Examiner*—Richard Isla Rodas
(74) *Attorney, Agent, or Firm*—Holland & Hart, LLP

(57) ABSTRACT

Apparatus is for processing signals between a tester and devices under test. In one embodiment, the apparatus includes at least one multichip module. Each multichip module has a plurality of micro-electromechanical switches between a set of connectors to the tester and a set of connectors to devices under test. At least one driver is provided to operate each of the micro-electromechanical switches. A method of processing signals between a tester and devices under test is disclosed. In an embodiment, the method includes connecting the tester and the devices under test with at least one multichip module. Each of the at least one multichip module has a plurality of micro-electromechanical switches between a set of connectors to the tester and a set of connectors to the devices under test. The method includes operating each of the micro-electromechanical switches. Other embodiments are also disclosed.

6 Claims, 4 Drawing Sheets

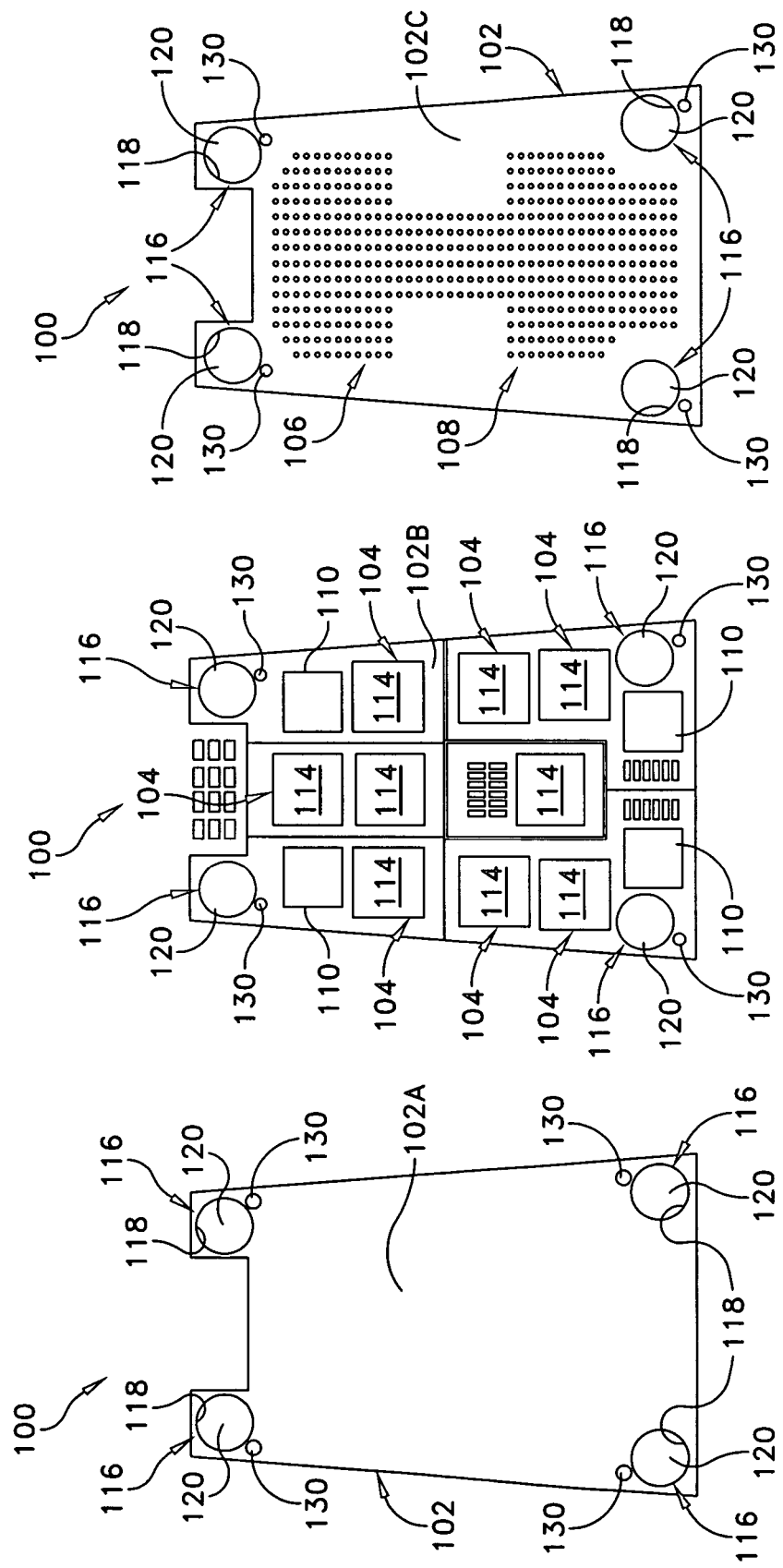

APPARATUS, SYSTEMS AND METHODS FOR PROCESSING SIGNALS BETWEEN A TESTER AND A PLURALITY OF DEVICES UNDER TEST AT HIGH TEMPERATURES AND WITH SINGLE TOUCHDOWN OF A PROBE ARRAY

BACKGROUND

Others have developed solutions for two touchdown testing of 300 mm wafers containing many NAND dice, e.g. 432 NAND dice having 16 test sites each for a total of 6912 test sites. Generally, this type of testing utilizes mechanical relays installed in the device under test (DUT) interface of the automatic test equipment (ATE) system. These relays are typically located electrically far away from the device under test (DUT). This distance may create a large impedance mismatch when reading back from the device. In addition, the maximum data rate for testing the device may be limited to only 20 MHz.

Mechanical relays are also quite expensive. For example, the typical mechanical relays may each cost about $8.00. This may limit the return on investment (ROI) for the customer. Mechanical relays are generally rated for about 1 to 10 million test cycles. This may create reliability issues for the customer over time. Furthermore, mechanical relays are only rated for operation up to 85° C. This allows testing of NAND devices using mechanical relays at or below 85° C.

Other solutions for multiplexing a large number of tester pin electronics (PE) by mounting a plurality of daughter boards on probe cards. This will only allow two touchdown testing of 300 mm wafers of NAND dice. This daughter card approach has limitations with respect to temperature and density. The connector limits the density of switches that can be placed on the daughter card and the active silicon switches have a temperature limitation of 85° C. when using standard grade integrated chips.

SUMMARY OF THE INVENTION

In an embodiment, there is provided apparatus for processing signals between a tester and a plurality of devices under test, the apparatus comprising at least one multichip module, each of the at least one multichip module comprising a plurality of micro-electromechanical switches between a first set of connectors to the tester and a second set of connectors to the plurality of devices under test; and at least one driver to selectively operate each of the plurality of micro-electromechanical switches.

In another embodiment, there is provided a system for testing a plurality of devices under test, the system comprising a set of tester electronics to generate signals for application to the plurality of devices under test, and to receive signals generated by the plurality of devices under test; a probe card with at least one multichip module mounted thereon, each of the at least one multichip module comprising a plurality of micro-electromechanical switches between a first set of connectors to the set of tester electronics and a second set of connectors to the plurality of devices under test, and a driver to selectively operate each of the plurality of micro-electromechanical switches; and a probe array to transmit signals between the at least one multichip module of the probe card and the plurality of devices under test.

In yet another embodiment, there is provided apparatus for processing signals between a tester and a plurality of devices under test, the apparatus comprising at least one multichip module mounted directly on a probe card and operable at a temperature of at least 125° C., and each of the at least one multichip module having a plurality of micro-electromechanical switches between a first set of connectors to the tester and a second set of connectors to the plurality of devices under test.

In still another embodiment, there is provided a method of processing signals between a tester and a plurality of devices under test, the method comprising connecting the tester and the plurality of devices under test with at least one multichip module, each of the at least one multichip module having a plurality of micro-electromechanical switches between a first set of connectors to the tester and a second set of connectors to the plurality of devices under test; and selectively operating each of the plurality of micro-electromechanical switches.

Other embodiments are also disclosed.

BRIEF DESCRIPTION OF THE DRAWINGS

Illustrative embodiments of the invention are illustrated in the drawings, in which:

FIGS. 1-3 illustrate one exemplary embodiment of a multichip module for processing signals between a tester and a plurality of devices under test;

DETAILED DESCRIPTION OF AN EMBODIMENT

Referring to FIGS. 1-7, there is shown apparatus 100 for processing signals between a tester and a plurality of devices under test. In one embodiment, apparatus 100 may include various types of multichip modules 102, which are also referred to as MCMs 102. FIGS. 1-3 illustrate one exemplary embodiment of multichip module 102. FIGS. 4-7 illustrate another exemplary embodiment of multichip module 102.

Figures 5, 6, 7:
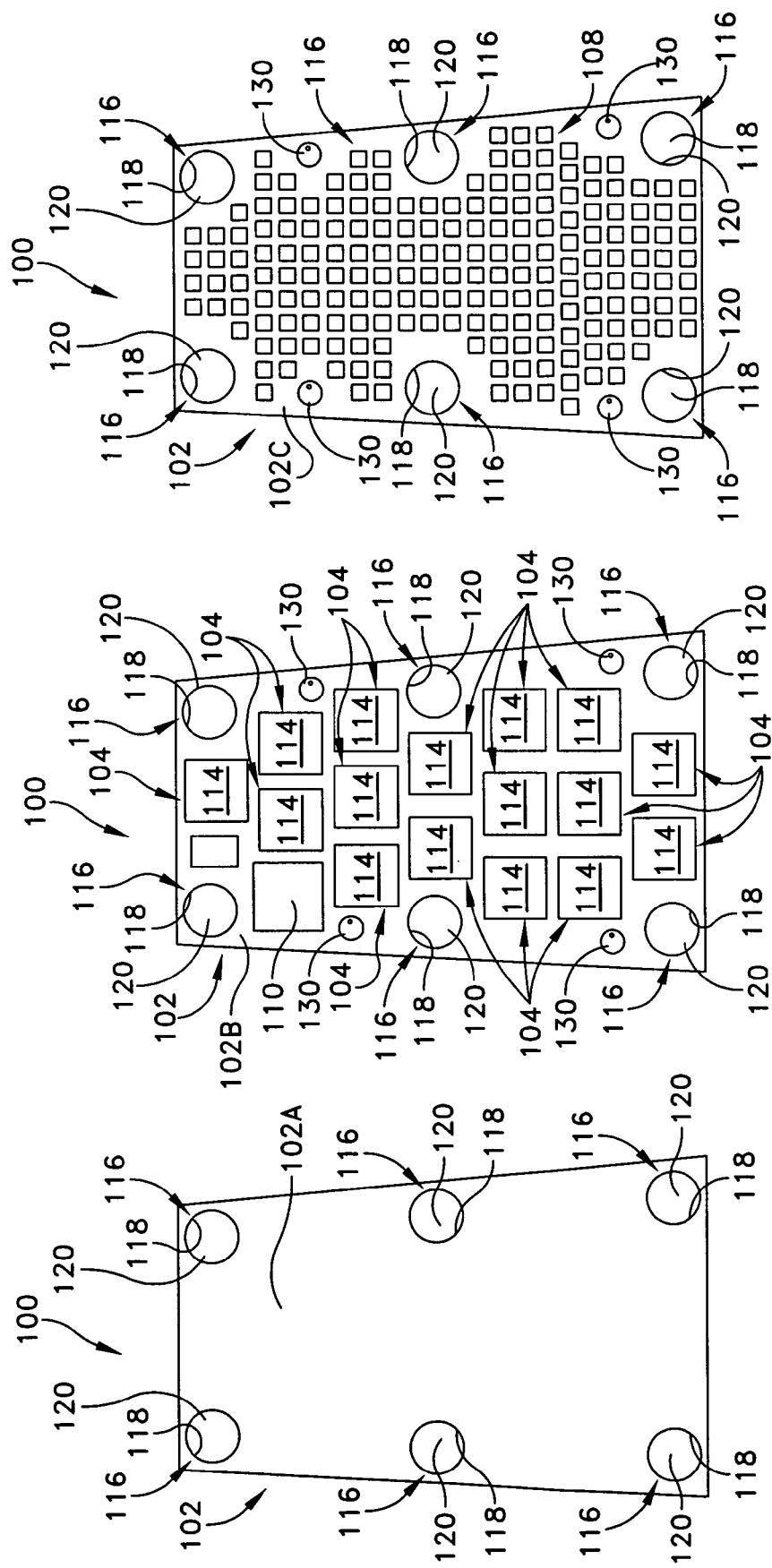
FIGS. 5-7 illustrate another exemplary embodiment of a multichip module for processing signals between a tester and a plurality of devices under test.

A top cover 102A of multichip module 102 is shown in FIGS. 1 and 5. A cross-sectional plan view 102B of multichip module 102 is shown in FIGS. 2 and 6. A bottom portion 102C is shown in FIGS. 3 and 6.

Referring to FIGS. 2 and 5, and each multichip module 102 may include a plurality of micro-electromechanical switches 104, which are also referred to as MEMs 104, between a first set of connectors 106 to the tester and a second set of connectors 108 to the plurality of devices under test. Each multichip module may include at least one driver 110 to selectively operate each of the plurality of micro-electromechanical switches 104.

Figure 4:
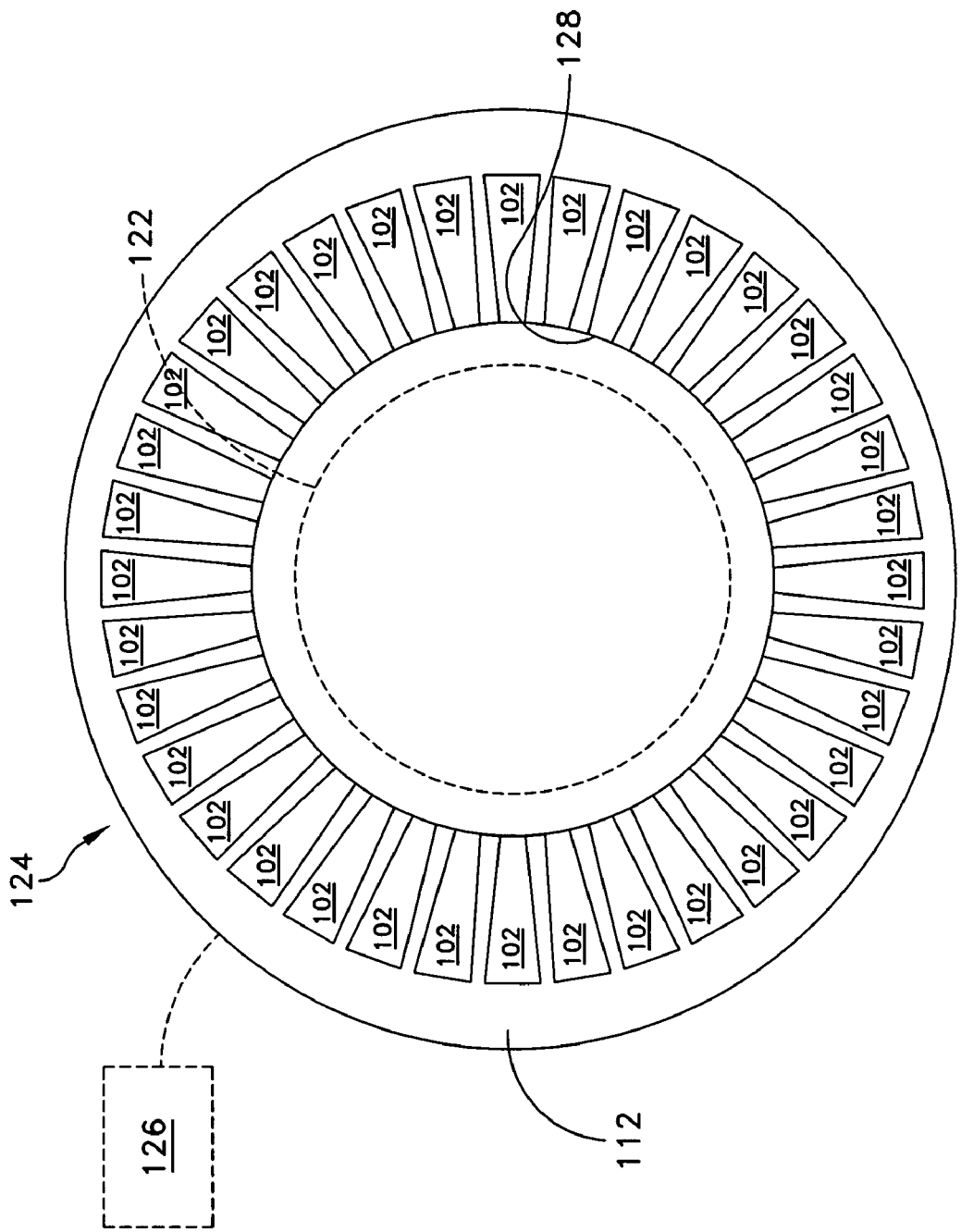
FIG. 4 illustrates a system having a probe card with a plurality of multichip modules for processing signals between a tester and a plurality of devices under test.

Looking at FIG. 4, and in an embodiment, apparatus 100 for processing signals may include a configuration in which each of multichip modules 102 are mounted directly on a probe card 112. Due to the proximity of multichip modules 102 to probe card 112 and the devices under test (not shown), one or more of multichip modules 102 may operate at a speed of at least 100 MHz. In another embodiment, one or more of multichip modules 102 may operate at a speed above 20 MHz to about 100 MHz.

In an embodiment, one or more of multichip modules 102 may operate at a temperature with a range from about −40° C. to about 125° C. In another embodiment, one or more of multichip modules 102 may operate within a temperature range from about 85° C. to about 125° C.

In one embodiment, one or more of multichip modules 102 may be rated for at least 1 billion test cycles. Multichip modules 102 may be rated for 10 billion or more test cycles. This is due, at least in part, to the micro-electromechanical switches 104 that may be used instead of other types of switches.

Referring to FIGS. 2 and 6, and in an embodiment, the plurality of micro-elecromechanical switches 104 may be housed in separate MEMs dice 114. In one embodiment, each of the separate MEMs dice 114 may include eight single pole triple throw switches (FIG. 2). In another embodiment, each of the separate MEMs dice 114 may include eight single pole double throw switches (FIG. 6).

Looking at FIGS. 1-3 and 5-7, an attachment component 116 may be provided to secure one or more of multichip modules 102. In an embodiment, attachment component 116 mounts multichip module 102 to probe card 112 (FIG. 4). Attachment component 116 may include passageways 118 through multichip module 102 for a set of screws 120 to mount the multchip module to probe card 112 (FIG. 4).

As MEM MCM 102 may be attached to probe card 112 using screws 120 or other fasteners, a new tester does not need to be purchased from a supplier of the ATE system. A customer may simply design a probe card and attach these MEM MCMs to the probe card and install this new probe card assembly onto an existing ATE system.

Generally, MCM 102 may be very thin to allow probe card 112 together with MCMs 102 to fit into an auto loader of a prober. Many screws 120 or other fasteners may be used to attach MCM 102 to probe card 112 to prevent warping.

In an embodiment, one or more of drivers 110 may designed to supply an electrostatic potential to selectively activate a MEMs gate associated with one or more of the plurality of micro-electromechanical switches 104. One or more of drivers 110 may be a vacuum-florescent display driver die 110. In one embodiment, four drivers 110 (FIG. 2) act as an algorithmic pattern generating system (APGS) and supply the electrostatic potential to four separate DUTs independently of one another. In another embodiment, one driver 110 (FIG. 6) acts as an algorithmic pattern generating system (APGS) and supplies electrostatic potential to DUTs.

In one embodiment, the second set of connectors of multichip modules 102 attach to a probe array 122. This probe array 122 may have at least 6000 probe tip needles so as to test at least 6000 test sites of the plurality of devices under test during a single touchdown of probe array 122. For example, each multichip module 102 may test 12 DUTs, there may be 36 multichip modules in attachment to probe card 112 for a total of 432 DUTs, and there may be 16 test sites on each one of the DUTs for a total of 6912 test sites, which in turn requires 6912 probe tip needles.

Referring to FIG. 4, and in an embodiment, there is shown a system 124 for testing a plurality of devices under test. System 124 may include a set of tester electronics 126 to generate signals for application to the plurality of devices under test, and to receive signals generated by the plurality of devices under test. System 124 may include probe card 112 with at least one multichip module 102 mounted directly on probe card 112. Each of the at least one multichip module 102 may include a plurality of micro-electromechanical switches 104 between a first set of connectors to the set of tester electronics 126 and a second set of connectors to the plurality of devices under test. System may include one or more drivers 110 to selectively operate each of the plurality of micro-electromechanical switches 104. System 124 may further include probe array 122 to transmit signals between the multichip modules 102 of probe card 112 and the plurality of devices under test.

In one embodiment, probe card 112 may have 36 multichip modules 102 mounted thereon. Each of multichip modules 102 may have a plurality of MEMS dice 114 thereon. Furthermore, each one of the plurality of MEMS dice 114 may each contain a plurality of switches 104. In one embodiment, switches 104 may include single pole triple throw switches. In another embodiment, switches 104 may include single pole double throw switches.

Looking at FIG. 1, and in an embodiment, each of multichip modules 102 may have 9 MEMS dice 114 thereon. In one embodiment, each of the 9 MEMS dice 114 may have 8 MEMS switches 104. Looking at FIG. 4, and in another embodiment, each of multichip modules 102 may have 16 MEMS dice 114 thereon. In an embodiment, each of the 16 MEMS dice 114 may have 8 MEMS switches 104.

Referring to FIGS. 3 and 7, and in an embodiment, each one multichip module 104 may be housed in a standard package configuration having 780 pins which may be configured on bottom portion 102C. A portion of the 780 pins form first set of connectors 106, which may provide electrical connection to tester electronics. Another portion of the 780 pins form second set of connectors 108, which may provide electrical connection to devices under test.

Probe card 112 may have a maximum diameter of 440 millimeters. Probe card 112 may form an opening 128 for probe array 122. In an embodiment, opening 128 has a minimum diameter of 330 millimeters. Probe card 112 may contains at least 36 of multichip modules 102 mounted thereon.

In an embodiment, probe array 112 may have at least 6000 probe tip needles so as to test at least 6000 test sites of the plurality of devices under test during a single touchdown of probe array 112.

In an embodiment, system 124 enables one touchdown testing of 300 mm wafers containing NAND devices to be tested up to 100 MHz by mounting micro-electromechanical multichip modules 102 very close to the DUTs. This one touchdown testing cannot be achieved by using mechanical relays or active silicon devices mounted on daughter boards. Daughter boards mounted on the probe cannot achieve the required density of switches because of the space required for connectors. Mechanical relays, which are mounted far from the DUTs, are generally limited to about 20 MHz and cannot achieve a data rate near 100 MHz.

For example, and looking at FIGS. 1-3, to achieve a desired data rate of about 20 MHz to about 100 MHz, 72 single-pole, triple-throw (SPTT) MEM switches 104 and four vacuum-florescent display driver dice (VFD) 110 may be integrated into one 780 pin multichip module (MCM) 102. This MCM 102 may measure 26 mm×55 mm×34 mm×55 mm (see FIG. 1).

In one embodiment, and looking at FIGS. 5-7, to achieve a desired data rate of about 20 MHz to about 100 MHz, 128 single-pole, double-throw (SPDT) MEM switches 104 and one vacuum-florescent display driver die (VFD) 110 with 32 outputs may be integrated into one 780 pin multichip module (MCM) 102. This MCM 102 may measure 26 mm×55 mm×34 mm×55 mm (see FIG. 5).

MEM MCMs 102 may be fabricated quite inexpensively. For example, an MCM package containing 128 SPDT switches with only 780 pins may cost about $300 per package. This drastically improves the return on investment (ROI) for the customer.

As discussed above, mechanical relays are generally rated a maximum testing temperature of 85° C., which is due to the moving parts inside the relay housing. Implementations using active silicon devices are also typically rated for a maximum testing temperature of 85° C. Using either of these, i.e. mechanical relays or daughter boards with active silicon, NAND devices may only be tested up to 85° C. However, using system 100, NAND devices may be tested at temperatures ranging from −40° C. to 125° C. with one or more of MEM MCMs 102.

MEM MCMs 102 are generally mounted very close to the DUTs so as to increase the maximum data rate for testing NAND devices from 20 MHz to 100 MHz, and also to enable testing of the entire 300 mm wafer with one touchdown.

Utilizing MEM MCMs 102 instead of mechanical relays is also more cost effective and more reliable. A typical mechanical relay is rated for 1-10 million cycles. A typical MEM MCM 102 may be rated for 1-10 billion cycles. Using daughter boards limits the density of switches that can be mounted on the probe card due to the space required for connectors.

Multichip modules 102 are generally capable of much higher densities than daughter cards. Mounting multichip modules 102 onto probe card 112 enables the customer to double the pin count of the test system when testing NAND devices without buying a new ATE system.

Using the Agilent V5400 test system, 16 NAND devices with 36 test sites each may be tested. Each MEMs dice may have 8 SPDT switches. The electrostatic potential required to activate the MEMs gate will be supplied by a vacuum-florescent display driver die 110 located inside the MCM package 102. MCM substrate 102B may be a blind and buried via substrate made of NELCO 4000-13 Si, which is a typical MCM substrate. Connectors 106 and connectors 108 may include, but are not limited to pins. Such pins of the package may include Be—Cu springs that are attached with silver epoxy to the bottom of the NELCO 4000-13 Si substrate. MEMs 104 and single VFD 110 may be located inside MCM 102 and may be wired bond or soldered to the substrate.

In an embodiment, MCMs 102 may be reusable. MCMs 102 can be transferred form one probe card to another when the probe card becomes damaged or is simply obsolete due to a change in die size or layout on the wafers.

Alignment pins 130 may be provided to align MCM 102 to probe card 112.

Figure 8:
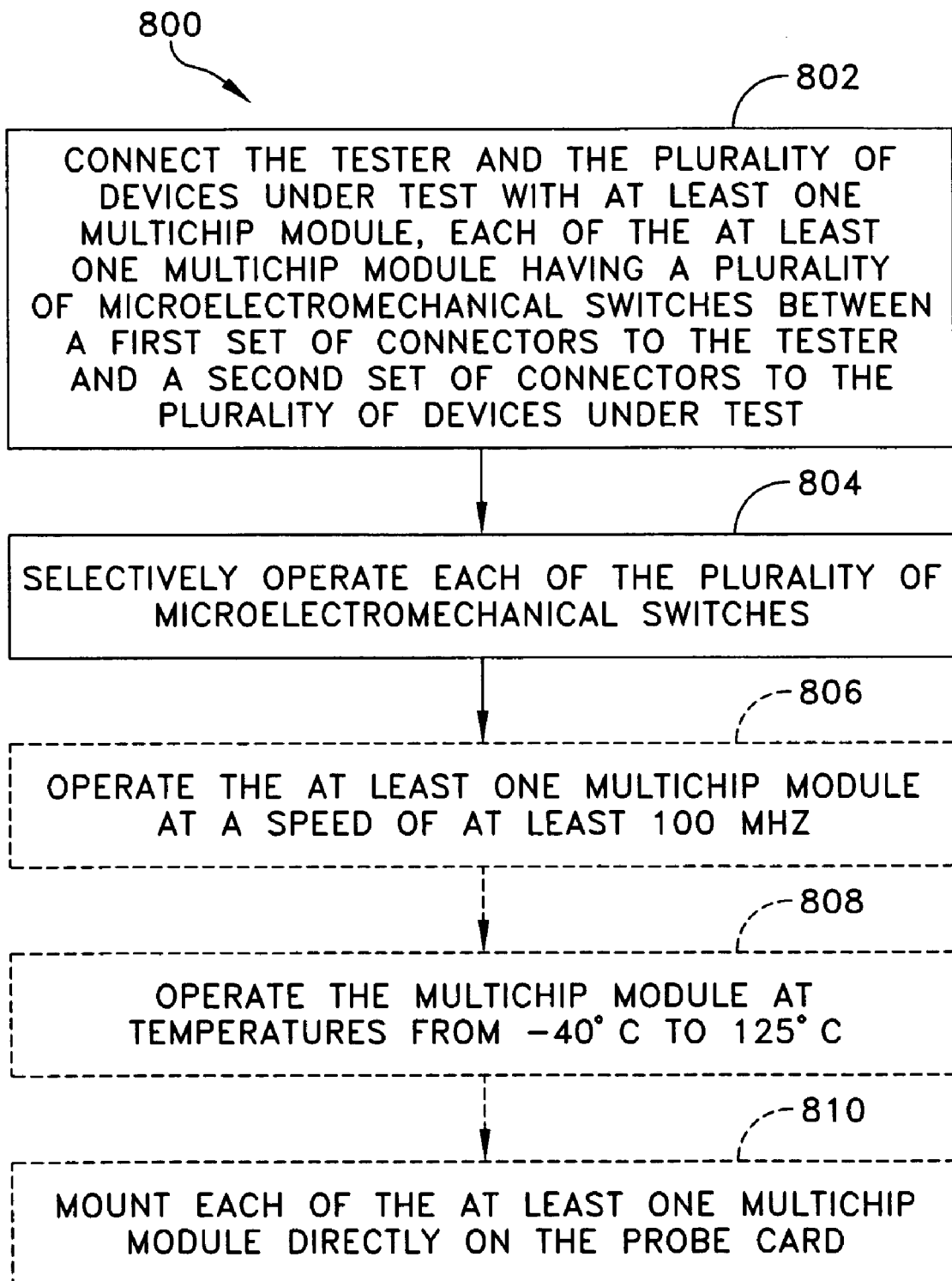
FIG. 8 is a flow chart diagram illustrative of methods of processing signals between a tester and a plurality of devices under test.

Looking now at FIG. 8, and in an embodiment, there is provided a method 800 of processing signals between a tester and a plurality of devices under test. Method 800 may include connecting 802 the tester and the plurality of devices under test with at least one multichip module, each of the at least one multichip module having a plurality of micro-electromechanical switches between a first set of connectors to the tester and a second set of connectors to the plurality of devices under test. Method 800 may include selectively operating 804 each of the plurality of micro-electromechanical switches.

In one embodiment, method 800 may further include operating 806 the at least one multichip module at a speed of at least 100 MHz. In an embodiment, method 800 may include operating 808 the multichip module at temperatures from −40° C. to 125° C.

Method 800 may include mounting 810 each of the at least one multichip module directly on the probe card.

What is claimed is:

1. A method of processing signals between a tester and a plurality of devices under test, the method comprising:
   mounting at least one multichip module directly on a probe card, each of the at least one multichip module having a plurality of micro-electromechanical switches connected between a first set of connectors and a second set of connectors, the mounting of the at least one multichip module directly on the probe card connecting the second set of connectors to a probe array of the probe card;
   connecting the first set of connectors to the tester by attaching the probe card, with the multichip modules mounted thereon, to the tester, wherein the first set of connectors are not connected to the tester when the probe card is not attached to the tester;
   connecting the plurality of devices under test to the probe array of the probe card; and
   selectively operating each of the plurality of micro-electromechanical switches to process the signals between individual ones of the first set of connectors to the tester and selected multiple ones of the second set of connectors to the plurality of devices under test.

2. A method in accordance with claim 1, further comprising operating the at least one multichip module at a speed of at least 100 MHz.

3. A method in accordance with claim 1, further comprising operating the multichip module at a temperature of at least 125° C.

4. A method in accordance with claim 1, further comprising operating the multichip module at a temperature of at least 125° C., and operating the at least one multichip module at a speed of at least 100 MHz.

5. A method in accordance with claim 1, wherein the at least one multichip module is directly mounted on the probe card by screwing the multichip module to the probe card.

6. A method in accordance with claim 1, wherein mounting the at least one multichip module directly to the probe card comprises mounting a plurality of multichip modules directly to the probe card.

* * * * *